(12) United States Patent
Eun

(10) Patent No.: US 8,211,779 B2
(45) Date of Patent: Jul. 3, 2012

(54) METHOD FOR FORMING ISOLATION LAYER IN SEMICONDUCTOR DEVICE

(75) Inventor: Byung-Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 204 days.

(21) Appl. No.: 11/958,381

(22) Filed: Dec. 17, 2007

(65) Prior Publication Data

US 2009/0068816 A1    Mar. 12, 2009

(30) Foreign Application Priority Data

Sep. 7, 2007   (KR) ........................ 10-2007-0091195

(51) Int. Cl.
*H01L 21/76* (2006.01)
*H01L 21/8238* (2006.01)
*H01L 21/336* (2006.01)
*H01L 21/311* (2006.01)
*H01L 21/469* (2006.01)

(52) U.S. Cl. ........ 438/435; 438/221; 438/294; 438/702; 438/769; 257/E21.546

(58) Field of Classification Search .......... 438/424–438, 438/694, 700–702, 210, 221, 294, 400, 637, 438/769, 781; 257/E21.546, E21.244, E21.271, 257/E21.282, E21.285, E21.548, E21.549, 257/E21.642
See application file for complete search history.

(56) References Cited

U.S. PATENT DOCUMENTS

| | | | |
|---|---|---|---|
| 6,287,988 B1 * | 9/2001 | Nagamine et al. ............ | 438/770 |
| 2002/0123206 A1 | 9/2002 | Hong et al. | |
| 2003/0013272 A1 * | 1/2003 | Hong et al. ................... | 438/437 |
| 2004/0072408 A1 * | 4/2004 | Yun et al. ...................... | 438/435 |
| 2004/0198019 A1 * | 10/2004 | Yasui et al. .................... | 438/435 |
| 2005/0009293 A1 | 1/2005 | Kim et al. | |
| 2005/0139938 A1 * | 6/2005 | Kim ............... | 257/412 |
| 2005/0167778 A1 * | 8/2005 | Kim et al. ...................... | 257/510 |
| 2006/0038254 A1 | 2/2006 | Jin | |
| 2006/0068562 A1 | 3/2006 | Nanda et al. | |
| 2006/0270183 A1 | 11/2006 | Kim et al. | |
| 2007/0020877 A1 | 1/2007 | Tseng et al. | |
| 2007/0173015 A1 * | 7/2007 | Im ................................ | 438/245 |

FOREIGN PATENT DOCUMENTS

| | | |
|---|---|---|
| CN | 1123921 C | 10/2000 |
| KR | 1020000003426 A | 1/2000 |
| KR | 1020020045401 A | 6/2002 |
| KR | 1020020061354 A | 7/2002 |
| KR | 1020050002317 A | 1/2005 |
| KR | 1020050118489 A | 12/2005 |
| KR | 1020060070364 A | 6/2006 |

* cited by examiner

*Primary Examiner* — Charles Garber
*Assistant Examiner* — Calvin Choi
(74) *Attorney, Agent, or Firm* — Kilpatrick Townsend & Stockton LLP

(57) ABSTRACT

Provided is a method for forming an isolation layer in a semiconductor device. In the method, a trench is formed in a semiconductor substrate, and a liner layer is formed on an exposed surface of the trench. A flowable insulation layer is formed to fill the trench. The flowable insulation layer is recessed. A buffer layer is formed on a portion of the liner layer that is formed on a sidewall of the trench and exposed after the flowable insulation layer is recessed. The buffer layer is etched to smoothen a rough portion of the liner layer that is formed when the flowable insulation layer is recessed. A buried insulation layer is deposited in the trench.

14 Claims, 10 Drawing Sheets

METHOD FOR FORMING ISOLATION LAYER IN SEMICONDUCTOR DEVICE

CROSS-REFERENCE TO RELATED APPLICATIONS

The priority of Korean patent application number 10-2007-0091195, filed on Sep. 7, 2007, which is incorporated by reference in its entirety is claimed.

BACKGROUND OF THE INVENTION

The invention relates to a semiconductor device, and more particularly, to a method for forming an isolation layer to uniformly fill trenches of a semiconductor device.

Owing to the development of semiconductor manufacturing technology, very fine patterns can be formed in a semiconductor device using small design rules, and thus the integration level of the semiconductor device can be increased. In manufacturing a semiconductor memory device, such as a direct random access memory (DRAM) having very fine patterns, a device isolation process is important to increase the data retention time of the semiconductor memory device for improving the production yield. Thus, many processes and materials have been studied and developed based on the isolation process to improve the data retention time of a semiconductor device.

Among various isolation processes, a shallow trench isolation (STI) process is widely used since devices can be efficiently isolated using narrow trenches and an isolation layer. In the STI process, trenches are formed in a semiconductor substrate to a predetermined depth through typical exposure and etch processes, and the trenches are filled with an insulation layer. Then, a planarization process is performed on the insulation layer to form an isolation layer in the trenches.

To improve gap-fill characteristics for filling trenches, a high density plasma (HDP) oxide layer is used as a gap-fill material or a deposition-etch-deposition (DED) method is used. However, the HDP oxide layer and the DED method are not suitable for filling trenches of a semiconductor device with sub-60-nm technology. In this case, trenches are filled with a flowable insulation layer formed of a compound including a solvent and a solute through a spin on dielectric (SOD) process.

In the SOD process, a compound including a solvent and a solute is applied to trenches using a coater to form a flowable insulation layer. Next, a curing process is performed to fill the trenches with the flowable insulation layer while densifying the flowable insulation layer. Then, the flowable insulation layer is recessed to a predetermined depth, and a trench isolation layer is formed in the trenches by filling the recessed portions of the flowable insulation layer with a HDP oxide layer. However, the SOD process has many limitations such as a difficulty to uniformly fill the trenches with the trench isolation layer. Therefore, there is a need for an improved method for forming an isolation layer in a semiconductor device to increase the process yield and stabilize device characteristics.

SUMMARY OF THE INVENTION

In one embodiment, there is provided a method for forming an isolation layer in a semiconductor device, the method including: forming a trench in a semiconductor substrate; forming a liner layer on an exposed surface of the trench; forming a flowable insulation layer to fill the trench; recessing the flowable insulation layer; forming a buffer layer on a portion of the liner layer formed on a sidewall of the trench and exposed after the flowable insulation layer is recessed; etching the buffer layer to smoothen a rough portion of the liner layer that is formed when the flowable insulation layer is recessed; and depositing a buried insulation layer in the trench.

The flowable insulation layer may be recessed about 1100 Å to about 1400 Å by using a wet etch chemical including a hydrofluoric acid (HF).

The forming of the buffer layer and the depositing of the buried insulation layer may be performed using a high density plasma (HDP) process.

The etching of the buffer layer may be performed using a fluorine (F) based etch gas. The liner layer may include a liner nitride layer and a liner oxide layer, and the etching of the buffer layer may be performed such that the liner nitride layer remains on the exposed surface of the trench. The etching of the buffer layer may be targeted to etch away a thickness of about 85 Å to about 95 Å of the buffer layer when the buffer layer has a thickness of about 250 Å to about 350 Å.

In another embodiment, there is provided a method for forming an isolation layer in a semiconductor device, the method including: forming a trench in a semiconductor substrate; forming a liner layer on an exposed surface of the trench, the liner layer including a liner nitride layer and a liner oxide layer; forming a flowable insulation layer to fill the trench; recessing the flowable insulation layer; forming a first buffer layer on a portion of the liner nitride layer exposed after the flowable insulation layer is recessed, the first buffer layer having a predetermined thickness for preventing generation of a void in a sidewall of the trench; forming a second buffer layer on the first buffer layer; etching the first and second buffer layers to smoothen a rough portion of the liner layer that is formed when the flowable insulation layer is recessed; and depositing a buried insulation layer in the trench, wherein the second buffer layer functions as a seed layer for the buried insulation layer.

In still another embodiment, there is provided a method for forming an isolation layer in a semiconductor device, the method including: forming a trench in a semiconductor substrate; forming a liner layer on an exposed surface of the trench, the liner layer including a liner nitride layer and a liner oxide layer; forming a flowable insulation layer to fill the trench; recessing the flowable insulation layer; loading the semiconductor substrate into a chamber; performing a first preheating process by supplying preheating gases including argon (Ar) and helium (He) gases to the chamber so as to release stress of the liner layer; performing a second preheating process by supplying a preheating gas to the chamber so as to oxidize a surface of the liner nitride layer exposed after the flowable insulation layer is recessed; forming a buffer layer on a portion of the liner nitride layer formed on a sidewall of the trench and exposed after the flowable insulation layer is recessed; etching the buffer layer by supplying an etch gas to the buffer layer so as to smoothen a rough portion of the liner layer that is formed when the flowable insulation layer is recessed; and depositing a buried insulation layer in the trench.

The forming of the buffer layer may include: forming a first buffer layer on the portion of the liner layer to a predetermined thickness for preventing generation of a void in the sidewall of the trench by supplying oxygen ($O_2$), silane ($SiH_4$), and helium (He) gases to the trench; and forming a second buffer layer as a seed layer for the buried insulation layer by supplying oxygen ($O_2$), silane ($SiH_4$), hydrogen ($H_2$), and helium (He) gases to the first buffer layer.

DESCRIPTION OF SPECIFIC EMBODIMENTS

Hereinafter, a method for forming an isolation layer in a semiconductor device in accordance with the invention will be described in detail with reference to the accompanying drawings, in which embodiments of the present invention are shown. The invention may, however, be embodied in many different forms and should not be construed as being limited to the embodiments set forth herein.

Figure 1:
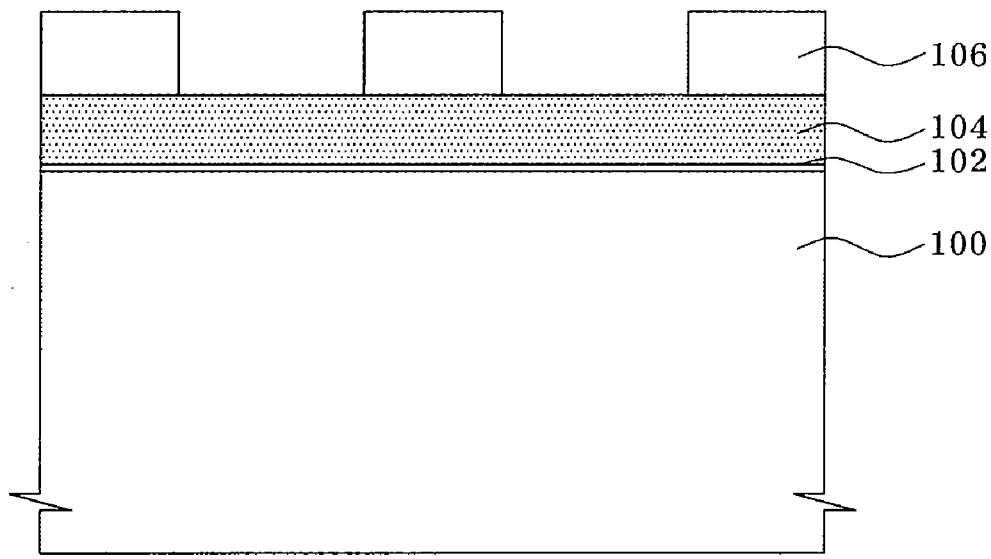
FIGS. 1 through 14 illustrate a method for forming an isolation layer in a semiconductor device according to an embodiment of the invention.

Referring to FIG. 1, a pad oxide layer 102 and a pad nitride layer 104 are sequentially deposited on a semiconductor substrate 100. The pad oxide layer 102 reduces stresses on the semiconductor substrate 100 caused by an attracting force exerted by the pad nitride layer 104. A photoresist layer is formed on the pad nitride layer 104 and is patterned to form a photoresist layer pattern 106 that selectively exposes the pad nitride layer 104. An isolation layer will be formed in exposed regions of the pad nitride layer 104 to define isolation regions, and the other regions of the pad nitride layer 104 covered with the photoresist layer pattern 106 will become active regions.

Figure 2:
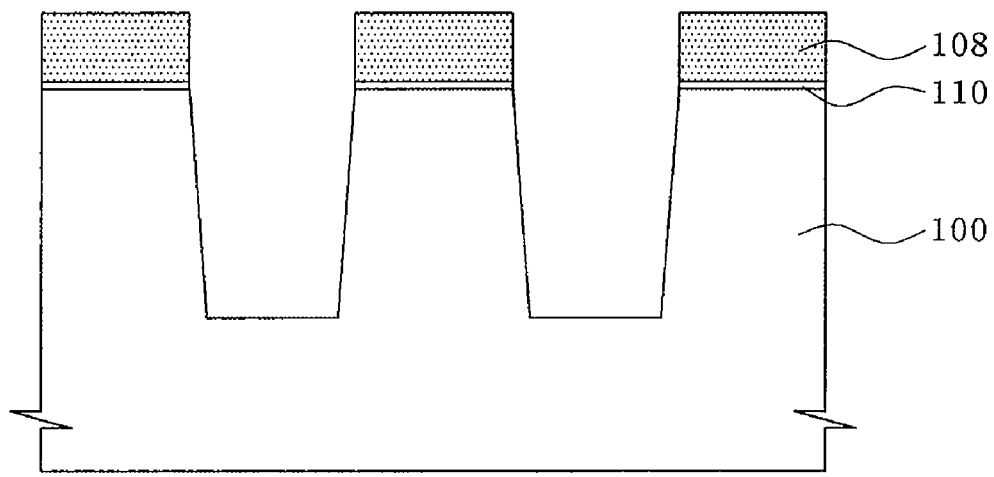

Referring to FIG. 2, an etch process is performed using the photoresist layer pattern 106 as a mask to form trenches 112 (refer to FIG. 3) having a predetermined depth.

In detail, the exposed regions of the pad nitride layer 104 are etched away using the photoresist layer pattern 106 as a mask to form a pad nitride layer pattern 108. Next, the photoresist layer pattern 106 is stripped (i.e., removed). Next, the pad oxide layer 102 is etched using the pad nitride layer pattern 108 as a mask to form a pad oxide layer pattern 110 that selectively exposes the semiconductor substrate 100. Then, exposed regions of the semiconductor substrate 100 are etched away using the pad nitride layer pattern 108 and the pad oxide layer pattern 110 as masks to form the trenches 112 in the semiconductor substrate 100 to a predetermined depth (e.g., about 1600 Å to about 1800 Å).

Figure 3:
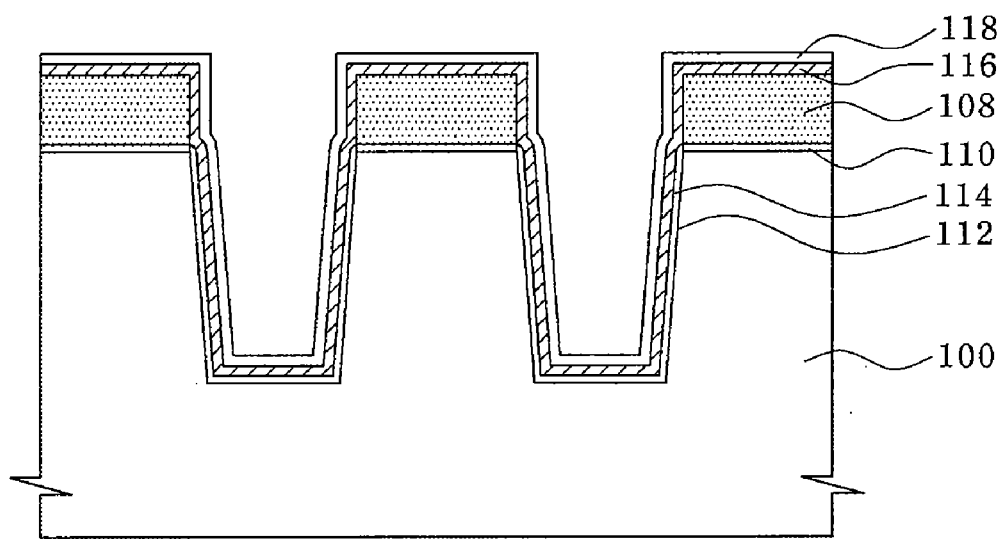

Referring to FIG. 3, an oxidation process is performed on the semiconductor substrate 100 to form a sidewall oxide layer 114 in the trenches 112. The sidewall oxide layer 114 can be formed by thermal oxidation. Portions of the semiconductor substrate 100 can be damaged during the formation of the trenches 112, thus the sidewall oxide layer 114 is formed to compensate for these damages. In addition, the sidewall oxide layer 114 prevents stresses that can be applied to the semiconductor substrate 100 by a subsequent liner nitride layer 116. These stresses occur when the liner nitride layer 116 is directly formed on the semiconductor substrate 100.

Next, the liner nitride layer 116 is deposited on the sidewall oxide layer 114 to a thickness of about 70 Å to about 75 Å. The liner nitride layer 116 prevents a leakage current caused by an oxide source permeated into the semiconductor substrate 100 during a process such as a gate oxidation process and a thermal process. In addition, the liner nitride layer 116 prevents a decrease in threshold voltage Vth caused by a dopant permeated into an isolation layer during an impurity implantation process for forming channels. Then, a liner oxide layer 118 is formed on the liner nitride layer 116.

Figure 4:
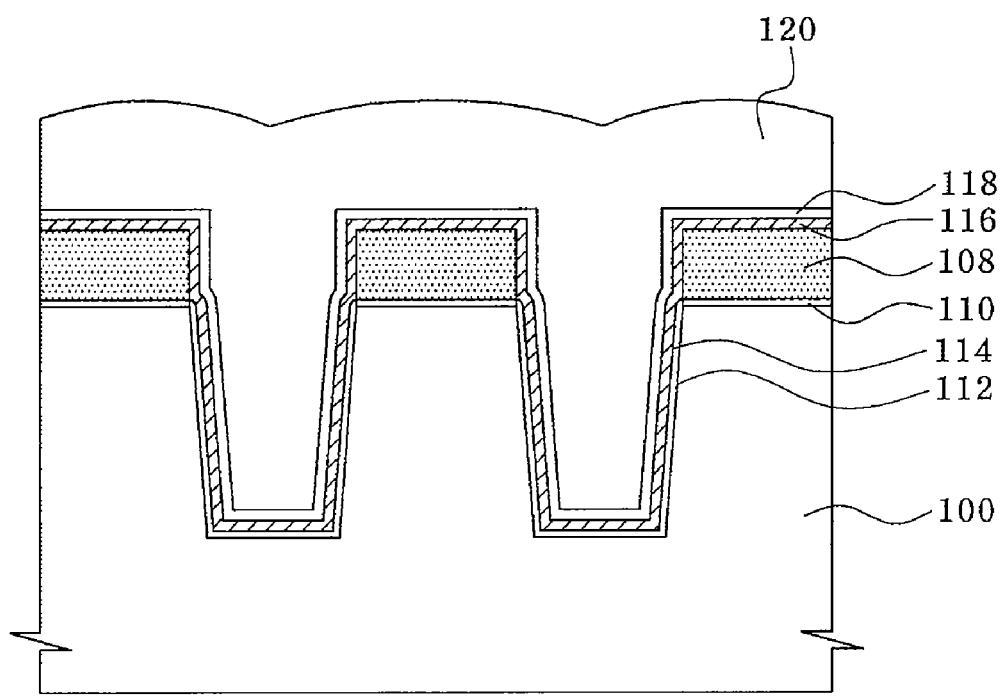

Referring to FIG. 4, a flowable insulation layer 120 is formed above the semiconductor substrate 100 to fill the trenches 112.

In detail, the semiconductor substrate 100 is loaded on a spin coater. Next, while rotating the spin coater, a compound including a solvent and a solute is applied to the semiconductor substrate 100 to form the flowable insulation layer 120 for filling the trenches 112. The flowable insulation layer 120 may be a spin on dielectric (SOD) layer having good reflow characteristics. In the current embodiment, the flowable insulation layer 120 is formed of polysilazane. Next, the flowable insulation layer 120 is treated by curing. The curing process can be performed in an $H_2$ or $O_2$ atmosphere.

Figure 5:
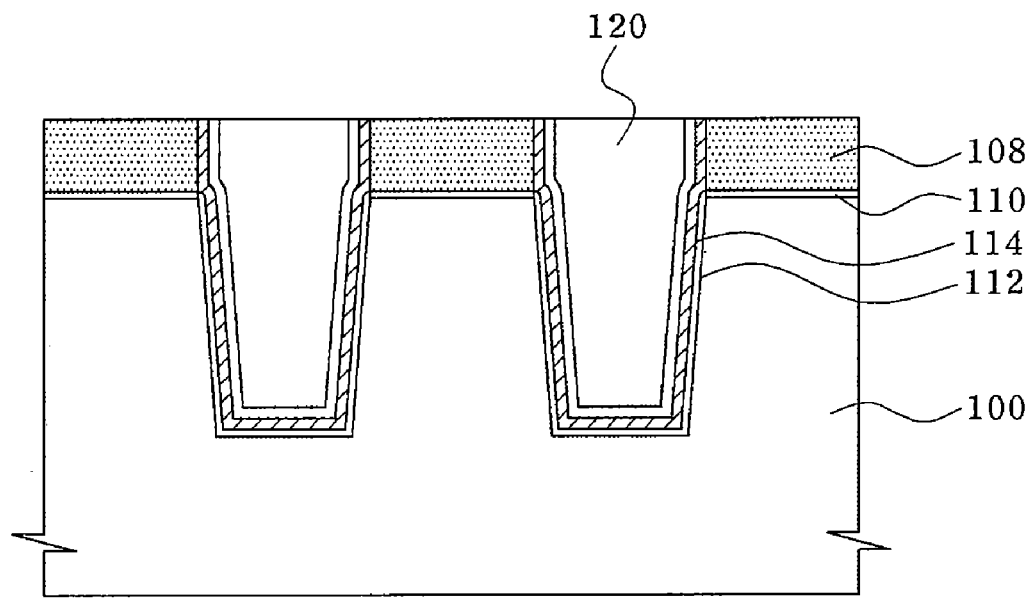

Referring to FIG. 5, a planarization process is performed on the flowable insulation layer 120. The planarization process is performed by chemical mechanical polishing (CMP) until the pad nitride layer pattern 108 is exposed. This is done so that the flowable insulation layer 120 can be uniformly recessed in a later process.

Figure 6:
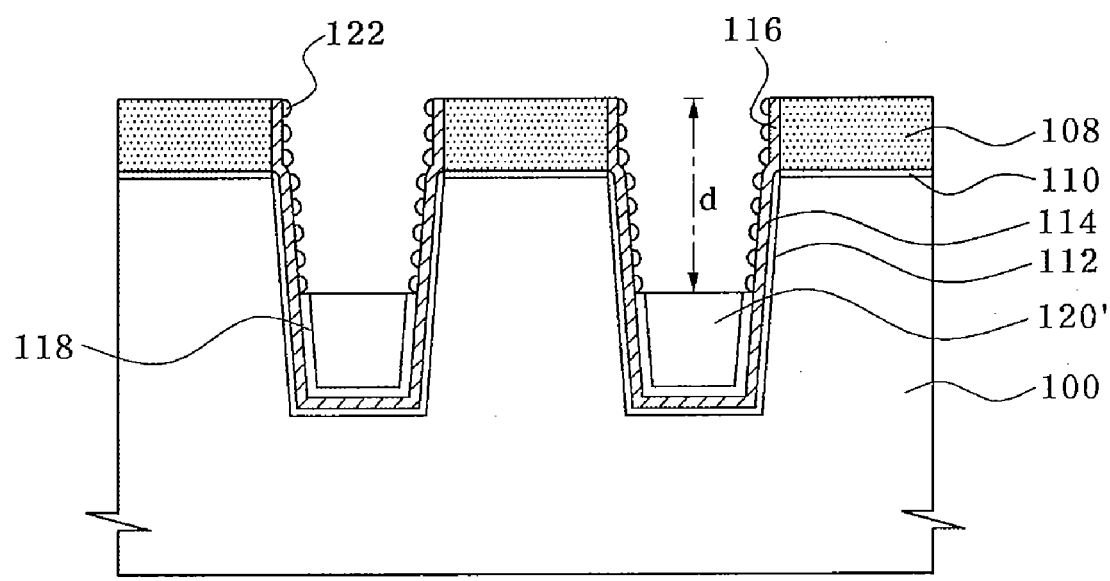

Referring to FIG. 6, after the planarization process, the flowable insulation layer 120 is recessed to a predetermined depth (d) to expose the liner nitride layer 116. The predetermined depth (d) may range from about 1100 Å to about 1400 Å. The flowable insulation layer 120 can be recessed through a wet etch process. The wet etch process can be performed using a wet etch chemical such as a HF solution. After the flowable insulation layer 120 is recessed, the flowable insulation layer 120 is denoted by reference numeral 120'. While the flowable insulation layer 120 is recessed, the liner oxide layer 118 is etched away to the predetermined depth (d). Therefore, the liner nitride layer 116 can be exposed to the same predetermined depth (d). In addition, while the flowable insulation layer 120 is recessed, exposed portions of the liner nitride layer 116 can be etched away. As a result, the thickness of the exposed portions of the liner nitride layer 116 may be reduced to a predetermined thickness, for example, about 40 Å.

Next, an annealing process is performed on the semiconductor substrate 100. In detail, the semiconductor substrate 100 is loaded in a furnace and is annealed at a temperature of about 900° C. to about 950° C. for about 20 seconds to about 30 seconds in order to densify the flowable insulation layer 120'.

In a conventional method, the trenches 112 may be fully filled through a high density plasma (HDP) process. However, in this case, a sufficient gap-fill margin cannot be allowed. Therefore, in the current embodiment, the trenches 112 are partially filled with the flowable insulation layer 120, and the remaining portions of the trenches 112 are filled through an HDP process. To partially fill the trenches 112 with the flowable insulation layer 120', the flowable insulation layer 120 is recessed. While the flowable insulation layer 120 is recessed, portions of the liner nitride layer 116 exposed through the trenches 112 can increase in roughness to form rough portions 122 on lateral surfaces of the trenches 112. For example, portions of the liner oxide layer 118 which are not etched away by an etchant such as a wet etch chemical can remain on the exposed portions of the liner nitride layer 116 to form the rough portions 122.

Figure 16:
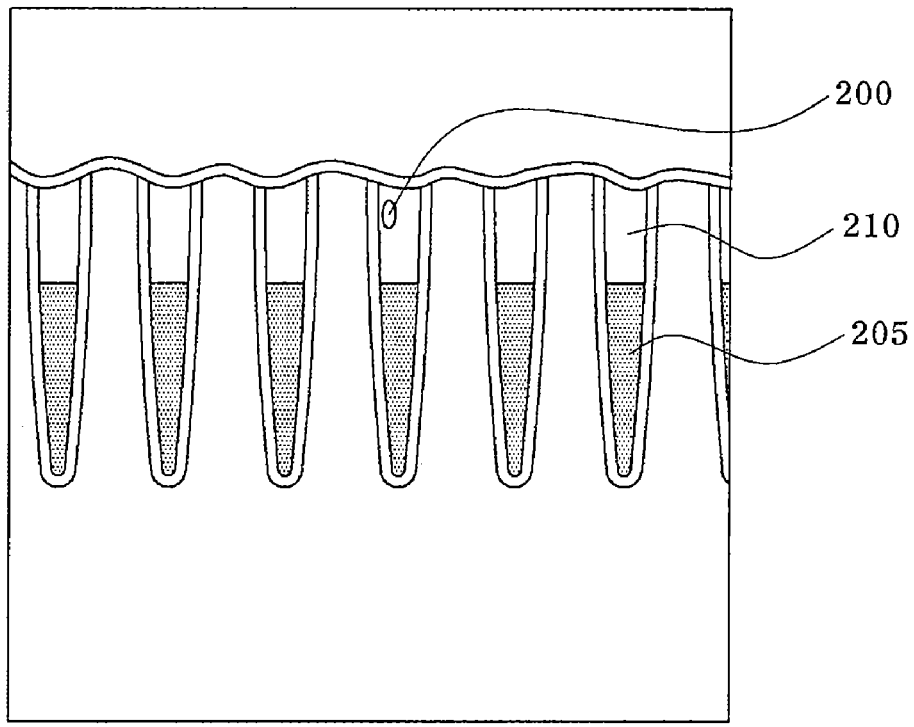
FIGS. 16 and 17 illustrate nano voids formed at lateral sides of trenches for explaining problems caused by the nano voids.

If a buried insulation layer is formed directly in the trenches 112 where the rough portions 122 exist, the growth rate of the buried insulation layer may be higher at lateral portions of the trenches 112 where the rough portions 122 exist than at bottom portions of the trenches 112. In this case, the lateral portions of the trenches 112 can be filled before the rough portions 122 are fully filled up, thereby causing defects such as nano voids. Referring to FIG. 16, a buried insulation layer 210 was formed in trenches of which lateral surfaces was rough. In this case, nano voids 200 were detected on the lateral surface of the trench. In FIG. 16, reference numeral 205 denotes a flowable insulation layer.

Figure 17:
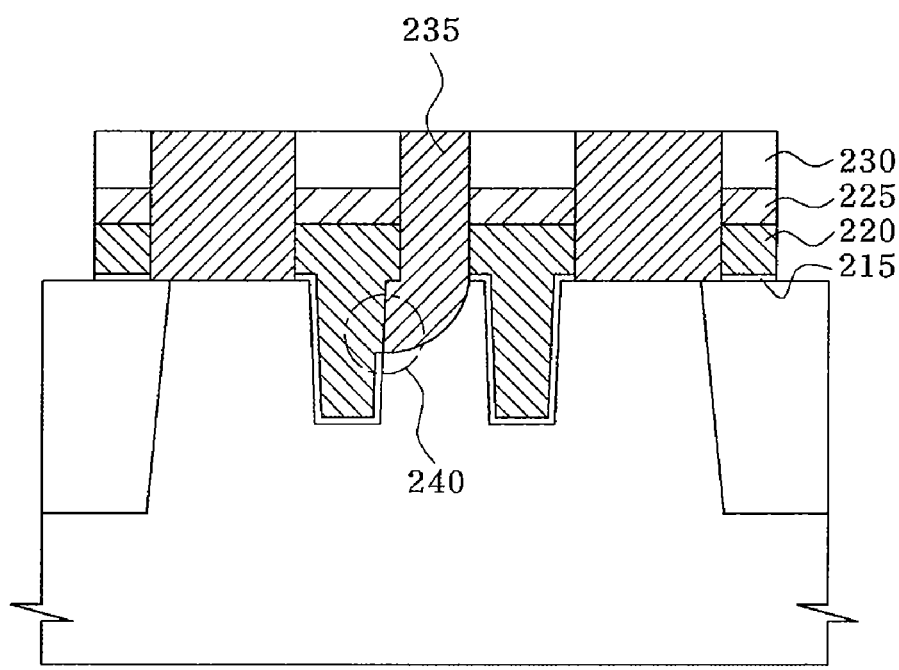

If the nano voids 200 exist, and for example, a process for forming a landing plug 235 is performed after forming a gate, a conductive material of the landing plug 235 can permeate into the nano voids 200, and thus the landing plug 235 can be connected to a conductive layer 220 of the gate (a bridge defect) as indicated by portion 240 in FIG. 17. Therefore, it is necessary to uniformly level the rough portions 122 formed on the lateral surfaces of the trenches 112 to prevent the bridge defect. In FIG. 17, reference numerals 215, 225, and 230 denote a gate insulation layer, a metal layer, and a hard mask layer, respectively.

Figure 7:
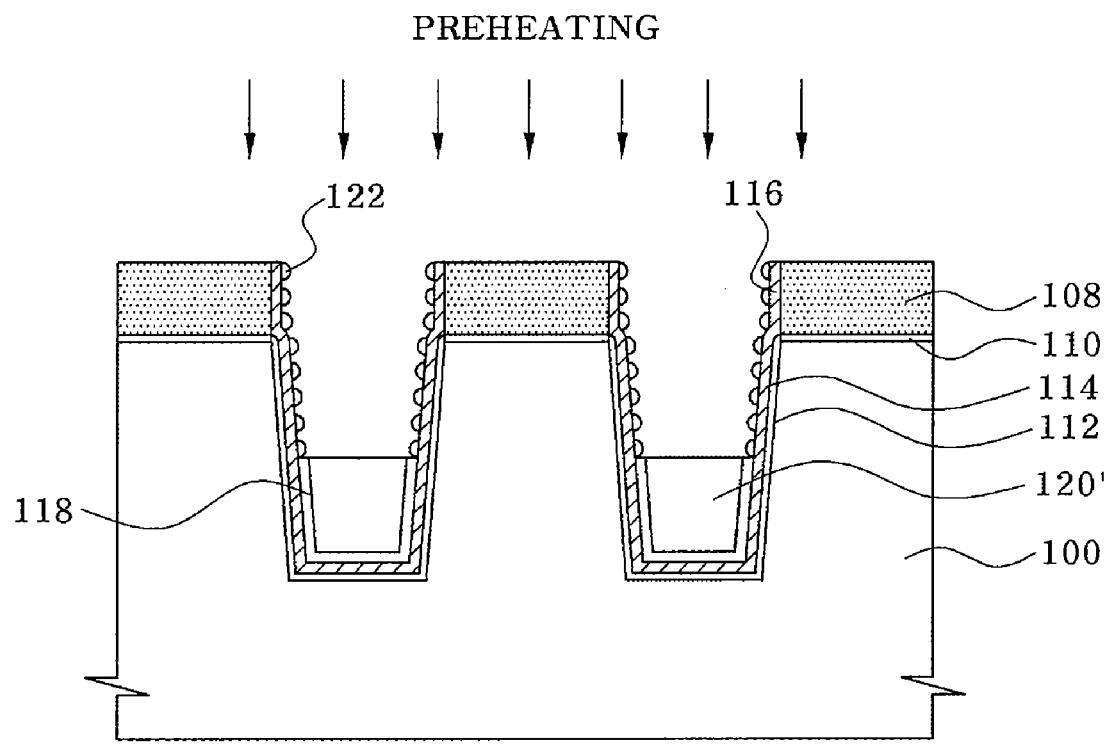
Figure 15:
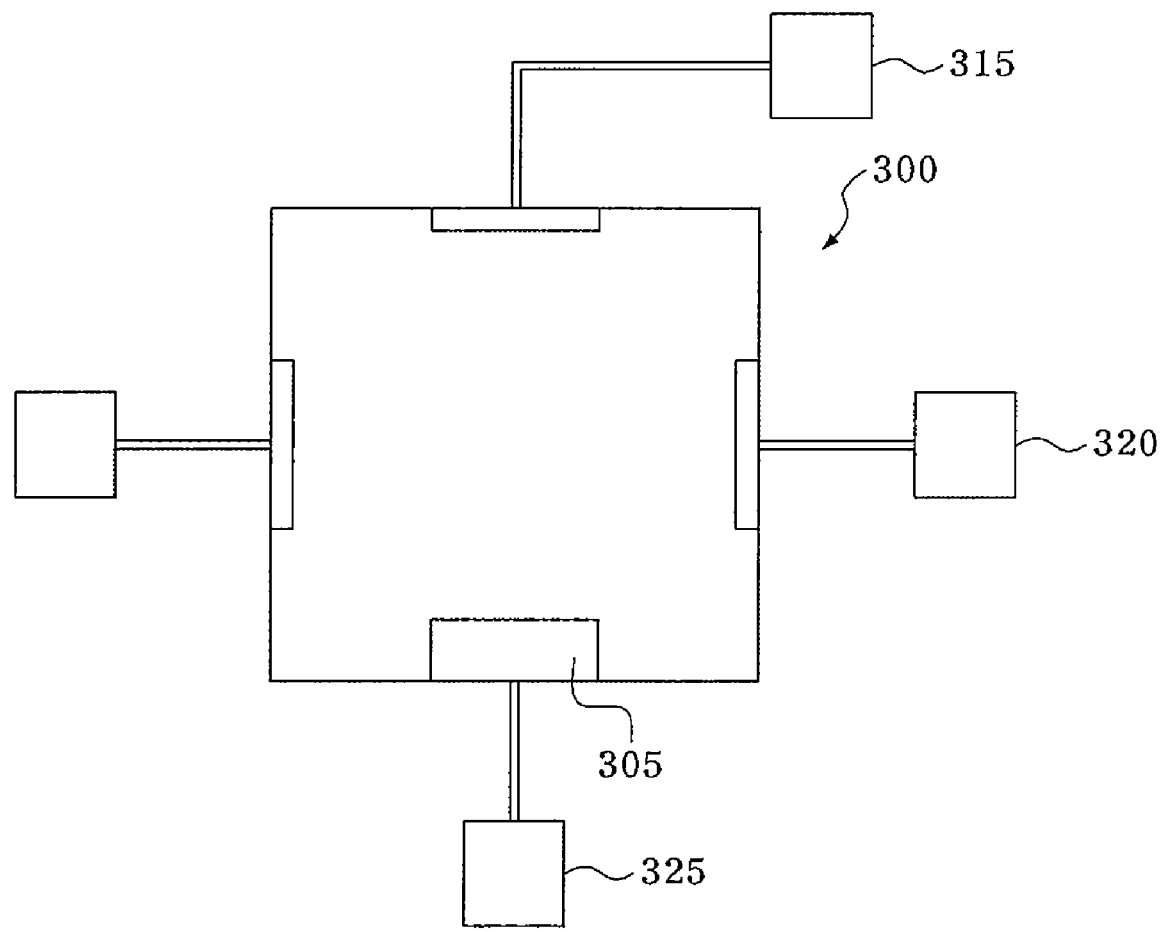
FIG. 15 illustrates a schematic view of a high density plasma (HDP) chamber according to an embodiment of the invention.

Referring to FIGS. 7 and 15, the semiconductor substrate 100 is treated through first and second preheating processes to reduce stresses in the sidewall oxide layer 114 and the liner nitride layer 116.

In detail, the semiconductor substrate 100 is loaded on a stage 305 of a high density plasma (HDP) chamber 300 shown in FIG. 15 for performing a HDP process. Next, while injecting argon (Ar) and helium (He) gases to the HDP chamber 300, predetermined power is supplied to the HDP chamber 300 to perform a first preheating process for about 50 seconds to about 55 seconds. During the first preheating process, stresses of the sidewall oxide layer 114 and the liner nitride layer 116 can be reduced. During the first preheating process, the argon (Ar) gas may be supplied to the HDP chamber 300 at a flow rate of about 60 sccm to 75 sccm. The helium (He) gas may be supplied to the HDP chamber 300 from lateral sides 320 at a flow rate of about 250 sccm to 350 sccm, and from a topside 315 at a flow rate of about 250 sccm to 350 sccm. Further, power ranging from about 4500 W to about 5500 W may be supplied to the HDP chamber 300 from the topside 315, and power ranging from 3500 W to 4500 W may be supplied to the HDP chamber 300 from the lateral sides 320 to generate plasma. No power is supplied to the HDP chamber 300 from a bottom side 325.

Next, a second preheating process is performed by supplying preheating gases including oxygen ($O_2$) to the semiconductor substrate 100 so as to prevent the liner nitride layer 116 from being damaged by oxidation. The second preheating process can be performed by injecting oxygen ($O_2$), argon (Ar), and Helium (He) gases into the HDP chamber 300 and supplying a predetermined power to the HDP chamber 300 for about five seconds to about ten seconds. The oxygen ($O_2$) gas can be injected to the HDP chamber 300 at a flow rate of about 50 sccm to about 150 sccm, and an inert gas including the argon (Ar) gas can be injected to the HDP chamber 300 at a flow rate of about 40 sccm to about 50 sccm. The helium (He) gas may be injected into the HDP chamber 300 together with the oxygen ($O_2$) gas and the argon (Ar) gas. The helium (He) gas may be injected at a flow rate of about 200 sccm to about 300 sccm. Power may be supplied to the HDP chamber 300 from the topside 315 in a range from about 4500 W to about 5500 W, and power may be supplied to the HDP chamber 300 from the lateral sides 320 in a range from about 3500 W to about 4500 W. No power is supplied to the HDP chamber 300 from the bottom side 325. The first and second preheating processes may be performed for no more than sixty seconds. Stresses in the liner nitride layer 116 can be released during the first and second preheating processes, and thus the liner nitride layer 116 can be prevented from lifting from the trenches 112.

Figure 8:
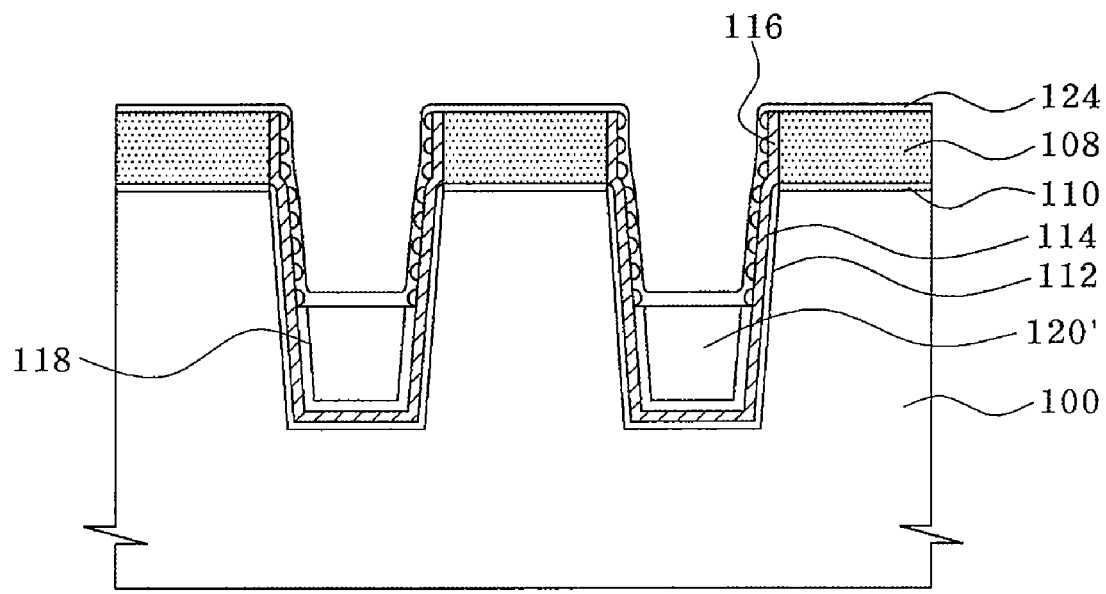

Referring to FIG. 8, a first buffer layer 124 is formed on the flowable insulation layer 120' and the rough portions 122 formed on the side surfaces of the trenches 112.

In detail, after the first and second preheating processes, a deposition source including oxygen ($O_2$), silane ($SiH_4$), and helium (He) gases is supplied to the HDP chamber 300. Here, the oxygen ($O_2$) may be supplied to the HDP chamber 300 at a flow rate of about 100 sccm to about 115 sccm. The silane ($SiH_4$) gas may be supplied to the HDP chamber 300 from the lateral sides 320 at a flow rate of about 40 sccm to about 55 sccm and from the topside 315 at a flow rate of about 25 sccm to about 35 sccm. The helium (He) gas may be supplied to the HDP chamber 300 from the lateral sides 320 at a flow rate of about 150 sccm to about 250 sccm and from the topside 315 at a flow rate of about 50 sccm to about 150 sccm. Power may be supplied to the HDP chamber 300 from the topside 315 in a range from about 7500 W to about 8500 W, and power may be supplied to the HDP chamber 300 from the lateral sides 320 in a range from about 4500 W to about 5500 W. Furthermore, power may be supplied to the HDP chamber 300 from the bottom side 325 in a range from about 450 W to about 550 W. As a result, the first buffer layer 124 is formed on the flowable insulation layer 120' and the side surfaces of the trenches 112 where the liner nitride layer 116 is exposed. The first buffer layer 124 is formed to a proper thickness so as to prevent generation of voids at the side surfaces of the trenches 112. The first buffer layer 124 may have a thickness in the range from about 250 Å to about 350 Å. Owing to the first buffer layer 124, the rough portions 122 can be smoothened.

Figure 9:
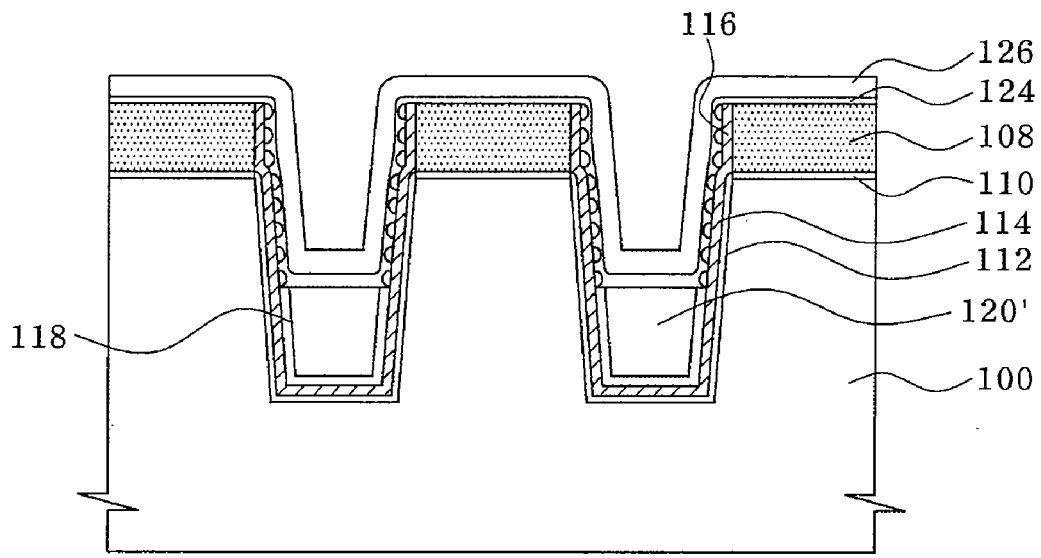

Referring to FIG. 9, an HDP deposition source is additionally supplied to the HDP chamber 300 to form a second buffer layer 126 that functions as a seed layer for a buried insulation layer.

In detail, oxygen ($O_2$), silane ($SiH_4$), hydrogen ($H_2$), and helium (He) gases are supplied to the HDP chamber 300. The oxygen ($O_2$) gas may be supplied to the HDP chamber 300 at a flow rate of about 70 sccm to about 80 sccm. The silane ($SiH_4$) gas may be supplied to the HDP chamber 300 from the lateral sides 320 at a flow rate of about 40 sccm to about 55 sccm and from the topside 315 at a flow rate of about 5 sccm to about 15 sccm. The helium (He) gas may be supplied to the HDP chamber 300 from the lateral sides 320 at a flow rate of about 250 sccm to about 350 sccm. The hydrogen ($H_2$) gas may be supplied to the HDP chamber 300 at a flow rate of about 100 sccm to about 150 sccm. Power may be supplied to the HDP chamber 300 from the topside 315 in a range from about 6500 W to about 7500 W, and power may be supplied to the HDP chamber 300 from the lateral sides 320 in a range from about 6500 W to about 7500 W. Furthermore, power may be supplied to the HDP chamber 300 from the bottom side 325 in a range from about 1500 W to about 2500 W. As a result, the second buffer layer 126 is formed on the first buffer layer 124 to a thickness of about 250 Å to about 350 Å.

If the second buffer layer 126 is applied thick to rapidly fill the trenches 112, the filling rate of the trenches 112 may be higher at the rough portions 122 than other portions. Therefore, nano voids 200 (refer to FIG. 16) can be generated on the side surfaces of the trenches 112. Therefore, in the current embodiment of the invention, each of the first and second buffer layers 124 and 126 has a thickness of about 350 Å or less, although the first buffer layer 124 has a thickness of about 350 Å or more and the second buffer layer 126 has a thickness of about 700 Å or more in a conventional method. For example, each of the first and second buffer layers 124 and 126 may have a thickness in the range from about 250 Å to 350 Å. Since the first and second buffer layers 124 and 126 have a relatively smaller thickness, the second buffer layer 126 can be completely formed before nano voids are generated from the rough portions 122 formed on the side surfaces of the trenches 112. Here, nano voids can be generated on bottom portions of the trenches 112. However, these nano voids on the bottom portions of the trenches 112 do not affect the characteristics of a semiconductor device.

Figure 10:
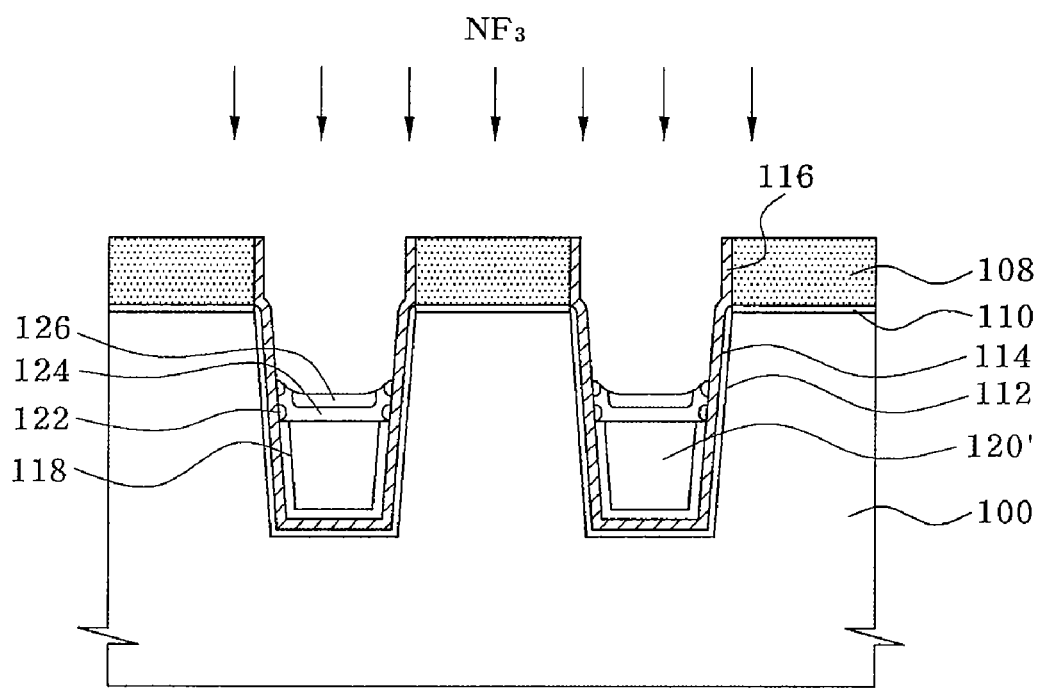

Referring to FIGS. 10 and 15, etch gases are supplied to the semiconductor substrate 100 to etch away the rough portions 122 from the trenches 112.

In detail, while injecting etch gases including nitrogen trifluoride ($NF_3$), hydrogen ($H_2$), and helium (He) gases into the HDP chamber 300, a predetermined power is supplied to the HDP chamber 300. Here, the nitrogen trifluoride ($NF_3$) gas may be supplied to the HDP chamber 300 at a flow rate of about 100 sccm to about 200 sccm, and the hydrogen ($H_2$) gas may be supplied to the HDP chamber 300 at a flow rate of about 100 sccm to about 200 sccm. The helium (He) gas may be supplied to the HDP chamber 300 at a flow rate of about 55 sccm to about 65 sccm. An additional amount of helium (He) gas can be supplied to the HDP chamber 300 from the topside 315 at a flow rate of about 55 sccm to about 65 sccm. As source powers to generate plasma, power may be supplied to the HDP chamber 300 from the topside 315 in a range from about 1500 W to about 2500 W, and power may be supplied to the HDP chamber 300 from the lateral sides 320 in a range from about 5500 W to about 6500 W. In addition, power may be supplied to the HDP chamber 300 from the bottom side 325 in a range from about 1000 W to about 1800 W.

While the first and second buffer layers 124 and 126 are etched away by the etch gases and the source powers, the rough portions 122 are also removed from the side surfaces of the trenches 112. Since the side power is relatively higher than the bottom power, a lateral etch rate is higher than a bottom etch rate such that a predetermined thickness of the first and second buffer layers 124 and 126 can remain on the flowable insulation layer 120'. Here, the etch process is performed in a manner such that the liner nitride layer 116 can remain in the trenches 112. For example, the etch process may be targeted to remove a thickness of about 85 Å to about 95 Å. Here, an etch target layer is determined based on a flat surface of the semiconductor substrate 100 such as a flat surface of the pad nitride layer pattern 108 or bottom surfaces of the trenches 112. In detail, when the first and second buffer layers 124 and 126 are deposited, the thickness of the first and second layers 124 and 126 may range from about 250 Å to about 350 Å based on the above-mentioned flat surface of the semiconductor substrate 100, and the thickness of the first and second buffer layers 124 and 126 is relatively smaller at the side surfaces of the trenches 112 than at the bottom surfaces of the trenches 112.

Therefore, the etch process may be targeted to remove a thickness of about 85 Å to about 95 Å based on the thinness of the first and second buffer layers 124 and 126 at the bottom surfaces of the trenches 112. When the etch process is performed in this way, the first and second buffer layer 124 and 126 may be removed from the side surfaces of the trenches. However, a predetermined thickness of the first and second buffer layers 124 and 126 may remain on the bottom surfaces of the trenches 112. Meanwhile, the liner nitride layer 116 is not damaged by the etch gases owing to the protection of the second buffer layer 126.

Figure 11:
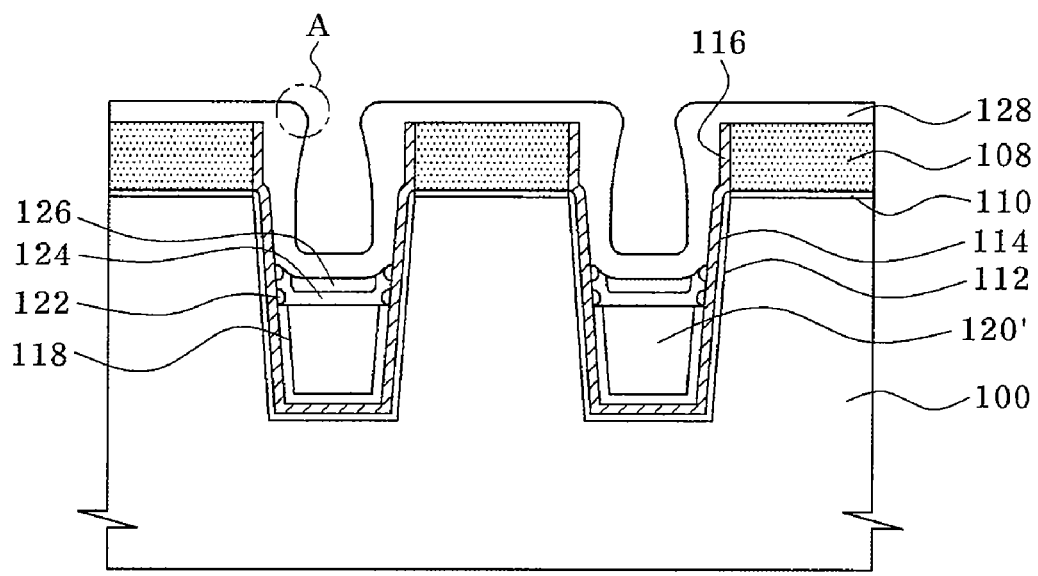

Referring to FIG. 11, after the etch process, a deposition source including oxygen ($O_2$), silane ($SiH_4$), hydrogen ($H_2$), and helium (He) gases is supplied to the HDP chamber 300 to form a HDP oxide layer 128 in the trenches 112.

In detail, the oxygen ($O_2$) gas may be supplied to the HDP chamber 300 at a flow rate of about 70 sccm to about 80 sccm. The silane ($SiH_4$) gas may be supplied to the HDP chamber 300 from the lateral sides 320 at a flow rate of about 40 sccm to about 55 sccm and from the topside 315 at a flow rate of about 5 sccm to about 15 sccm. The helium (He) gas may be supplied to the HDP chamber 300 from the lateral sides 320 at a flow rate of about 250 sccm to about 350 sccm. The hydrogen ($H_2$) gas may be supplied to the HDP chamber 300 at a flow rate of about 100 sccm to about 150 sccm. Power may be supplied to the HDP chamber 300 from the topside 315 in a range from about 6500 W to about 7500 W, and power may be supplied to the HDP chamber 300 from the lateral sides 320 in a range from about 6500 W to about 7500 W. Furthermore, power may be supplied to the HDP chamber 300 from the bottom side 325 in a range from about 1500 W to about 2500 W. In this way, the HDP oxide layer 128 is formed in the trenches 112 to a thickness of about 450 Å to about 550 Å. Here, since the trenches 112 are narrow, the HDP oxide layer 128 can overhang at upper portions of the trenches 112 (refer to portion A in FIG. 11).

Figure 12:
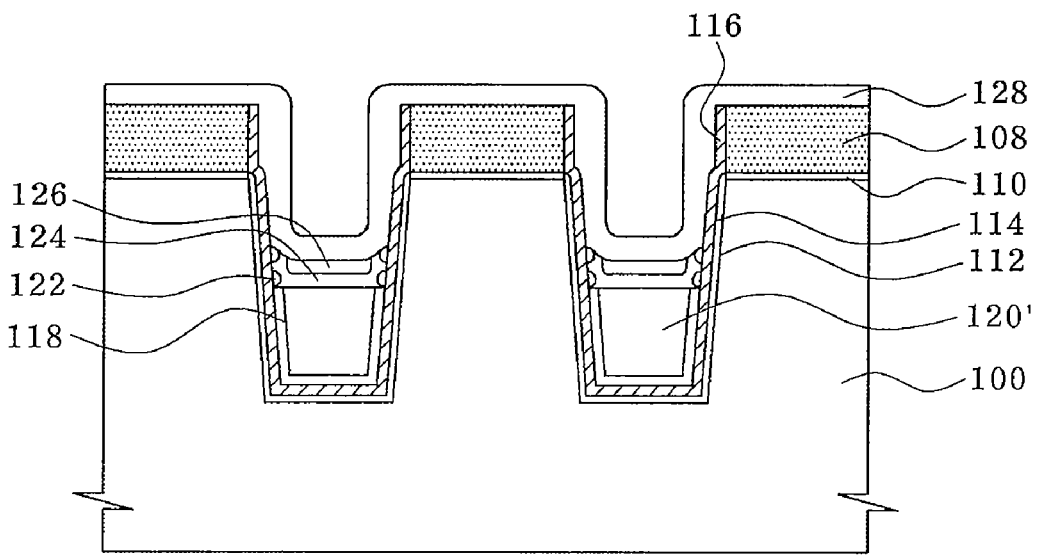

Referring to FIGS. 12 and 15, etch gases are supplied to the HDP chamber 300 to etch away the overhangs A of the HDP oxide layer 128 from the upper portions of the trenches 112.

The etch gases supplied to the HDP chamber 300 includes nitrogen trifluoride ($NF_3$), hydrogen ($H_2$), and helium (He) gases. The nitrogen trifluoride ($NF_3$) gas may be supplied to the HDP chamber 300 at a flow rate of about 100 sccm to about 200 sccm, and the hydrogen ($H_2$) gas may be supplied to the HDP chamber 300 at a flow rate of about 100 sccm to about 200 sccm. The helium (He) gas may be supplied to the HDP chamber 300 at a flow rate of about 55 sccm to about 65 sccm. An additional amount of helium (He) gas can be supplied to the HDP chamber 300 from the topside 315 at a flow rate of about 55 sccm to about 65 sccm. As source powers to generate plasma, power may be supplied to the HDP chamber 300 from the topside 315 in a range from about 1500 W to about 2500 W, and power may be supplied to the HDP chamber 300 from the lateral sides 320 in a range from about 5500 W to about 6500 W. In addition, power may be supplied to the HDP chamber 300 from the bottom side 325 in a range from about 1000 W to about 1800 W. This etch process may be targeted to remove a thickness of about 85 Å to about 95 Å of the HDP oxide layer 128 for removing the overhangs A. The overhangs A of the HDP oxide layer 128, which are formed at the upper portions of the trenches 112 due to deposition rate variations, can be removed through the etch process, and thus the HDP oxide layer 128 can be smoothened at the upper portions of the trenches 112.

Figure 13:
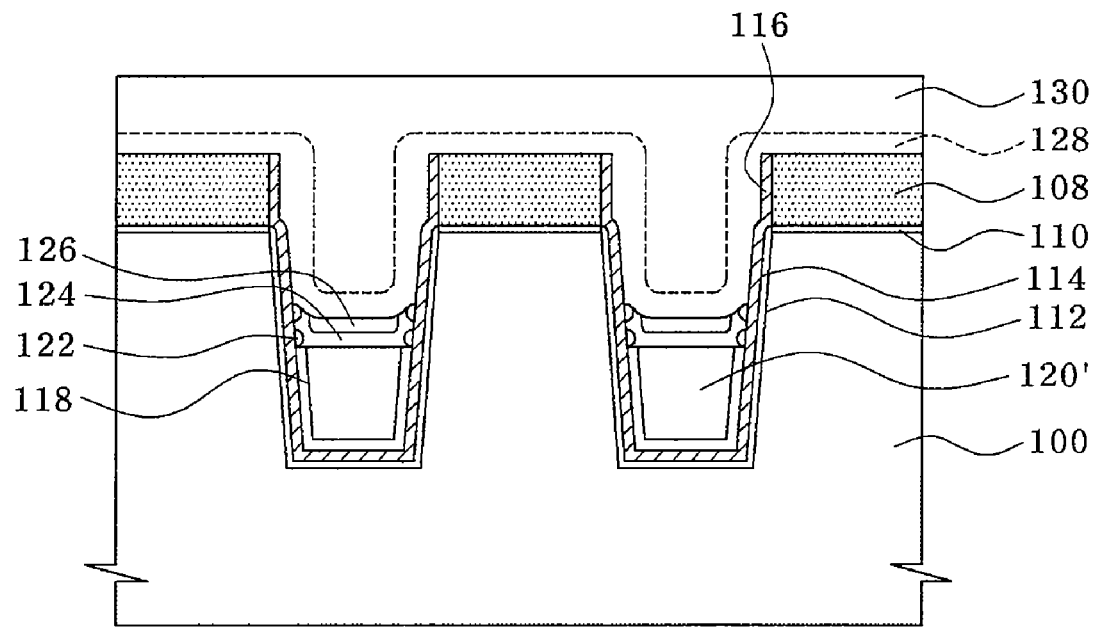

Referring to FIG. 13, the trenches 112 are filled with a buried insulation layer 130 by repeating an HDP oxide layer deposition process and an overhang etch process. That is, deposition is repeated after removing overhangs that obstruct filling of the trenches 112 in order to improve gap-fill characteristics for filling the trenches 112. The HDP oxide layer deposition and the overhang etch process may be repeated five times (5 cycles) or more.

In a conventional method, an HDP oxide layer is formed to a thickness of about 700 Å or more, a thickness of about 150 Å or more of the HDP oxide layer is etched away, and the formation of the HDP oxide layer and the etching of the HDP oxide layer are repeated to form a buried insulation layer. However, in the current embodiment of the invention, the HDP oxide layer 128 is formed to a thickness of about 450 Å to about 550 Å, a thickness of about 85 Å to about 95 Å of the HDP oxide layer 128 is etched away, and the formation of the HDP oxide layer 128 and the etching of the HDP oxide layer 128 are repeated to form the buried insulation layer 130. Therefore, nano voids can be reduced. Meanwhile, the first and second preheating processes to the etching process of the overhangs A of the HDP oxide layer 128 can be performed in-situ in the HDP chamber 300.

Figure 18A:
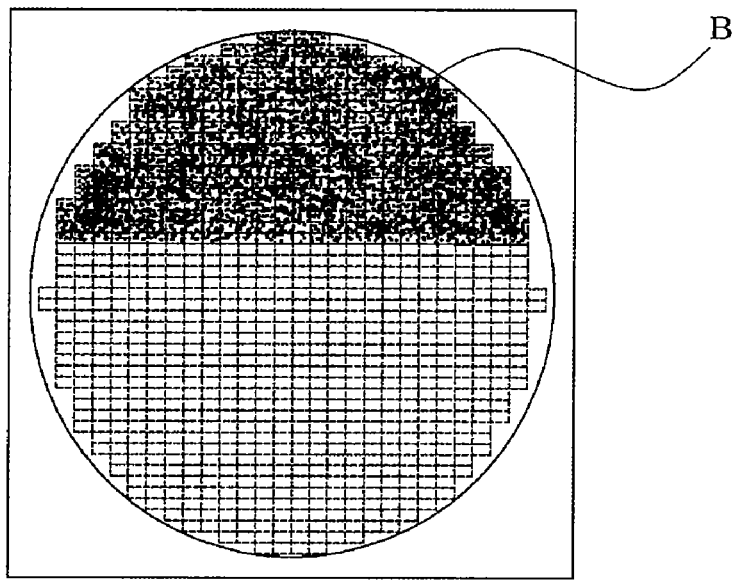
FIGS. 18A and 18B illustrate defects detected using an inspection device.
Figure 18B:
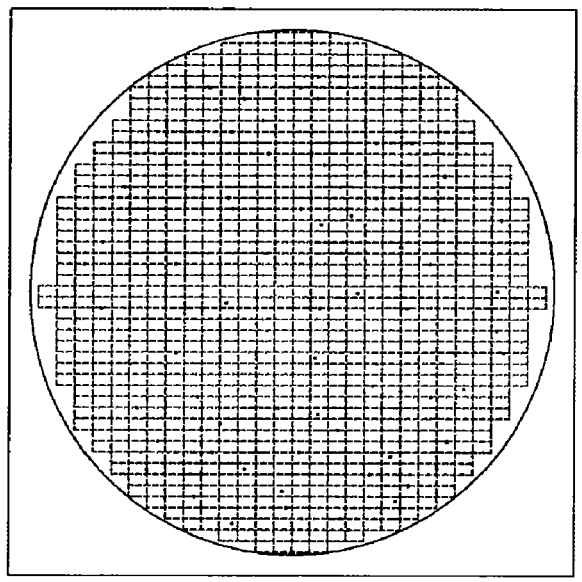

As explained above, the roughness of the lateral surfaces of the trenches 112 can be reduced using the first and second buffer layers 124 and 126. Furthermore, the thicknesses of the first and second buffer layers 124 and 126 are adjusted to completely form the second buffer layer 126 (a seed layer of the buried insulation layer 130) before the second buffer layer 126 makes contact with portions where nano voids can grow, and the rough portions 122 are removed from the lateral surfaces of the trenches 112 by etching to prevent generation of nano voids. After forming landing plugs using a conductive material, bridge defects were inspected using an electron beam inspection (EBI) device. Referring to FIGS. 18A and 18B, although many bridge defects(B) were detected in a wafer processed by a conventional method, much fewer bridge defects were detected in a wafer processed according to the current embodiment of the invention.

Figure 14:
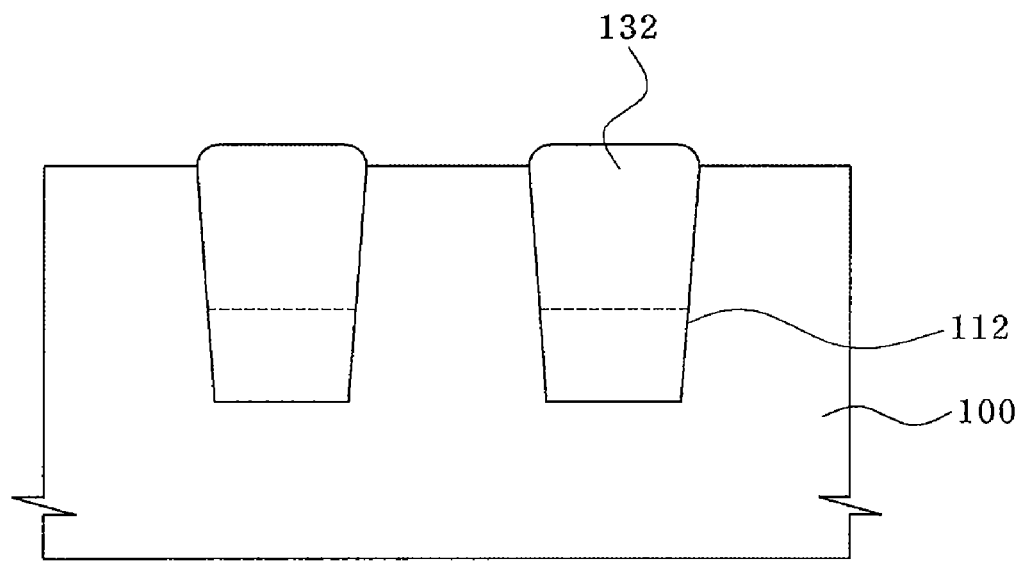

Referring to FIG. 14, a planarization process is performed on the buried insulation layer 130 until the pad nitride layer pattern 108 is exposed, and the pad nitride layer pattern 108 and the pad oxide layer pattern 110 are removed to form a trench isolation layer 132. Here, the planarization process of the buried insulation layer 130 can be performed by chemical mechanical polishing (CMP).

In the method for forming an isolation layer in a semiconductor device according to the invention, the first and second buffer layers are formed on the rough portions of the trenches that were formed when the flowable insulation layer is recessed in order to smoothen the rough portions, and then the rough portions are removed using etch gases. Therefore, generation of nano voids can be prevented when the buried insulation layer is formed. The semiconductor device can be prevented from being deteriorated by, for example, bridge detects caused by a conductive layer permeated into the isolation layer. Furthermore, since grow rates at the lateral and bottom surfaces of the trenches are adjusted by forming the first and second buffer layers to thin thicknesses, generation of nano voids can be effectively prevented. In other words, the deposition thicknesses of the first and second buffer layers are adjusted to completely form the second buffer layer (a seed layer of the buried insulation layer) before the second buffer layer makes contact with portions where nano voids can grow, and then the rough portions are removed from the lateral surfaces of the trenches by etching in order to prevent generation of nano voids.

While the invention has been described with respect to the specific embodiments, it will be apparent to those skilled in the art that various changes and modifications may be made without departing from the spirit and scope of the invention as defined in the following claims.

What is claimed is:

1. A method for forming an isolation structure in a semiconductor device, the method comprising:
    forming a trench in a semiconductor substrate;
    forming a liner nitride layer over an exposed surface of the trench;
    forming a liner oxide layer on the liner nitride layer;
    forming a flowable insulation layer over the trench by applying a compound including a solvent and a solute to completely fill the trench;
    etching the flowable insulation layer and the liner oxide layer to partially open the trench and expose an upper portion of the liner nitride layer in the trench so that portions of the etched liner oxide layer remain to form rough portions on a sidewall of the liner nitride layer in the trench;
    forming a buffer layer on the etched flowable insulation layer and on the exposed upper portion of the liner nitride layer including the rough portions;
    etching the buffer layer to remove the buffer layer and the rough portions from the sidewall of the trench so that a portion of the buffer layer and a corresponding portion of the rough portions remains over the flowable insulation layer and a portion of the liner nitride layer remains on the sidewall of the trench; and
    depositing a buried insulation layer on the remaining portion of the buffer layer and on the remaining portion of the liner nitride layer in the trench to form an isolation structure.

2. The method of claim 1, wherein the etching of the flowable insulation layer is performed using a wet etch chemical comprising a hydrofluoric acid (HF).

3. The method of claim 1, wherein the flowable insulation layer is etched to reduce a thickness by about 1100 Å to about 1400 Å.

4. The method of claim 1, wherein the forming of the buffer layer and the depositing of the buried insulation layer are performed using a high density plasma (HDP) process.

5. The method of claim 1, wherein the etching of the buffer layer is performed using a fluorine (F) based etch gas.

6. The method of claim 1, wherein the etching of the buffer layer is targeted to reduce a thickness of ¼ to ⅓ of the buffer layer.

7. The method of claim 1, further comprising performing a thermal oxidation process on the semiconductor substrate to form a sidewall oxide layer in the trench prior to the act of forming a liner nitride layer.

8. A method for forming an isolation structure in a semiconductor device, the method comprising:
    forming a trench in a semiconductor substrate;
    forming a liner nitride layer over an exposed surface of the trench;
    forming a liner oxide layer on the liner nitride layer;
    forming a flowable insulation layer to completely fill the trench by applying a compound including a solvent and a solute;
    etching the flowable insulation layer and the liner oxide layer to partially open the trench and expose an upper portion of the liner nitride layer provided on a sidewall of the trench so that portions of the etched liner oxide layer remain to form rough portions due to the etching of the flowable insulation layer, portions of the liner nitride layer being exposed between the rough portions;
    forming a first buffer layer on the etched flowable insulation layer and on the exposed upper portion of the liner nitride layer including the rough portions;
    forming a second buffer layer on the first buffer layer;
    etching the first and second buffer layers to remove the first and second buffer layers and the rough portions from the sidewall of the trench so that a portion of the first and second buffer layers and a corresponding portion of the rough portions remains over the flowable insulation layer and the liner nitride layer remains on the sidewall of the trench; and
    depositing a buried insulation layer on the remaining portion of the first and second buffer layers and on the liner nitride layer in the trench to form an isolation structure, wherein the first buffer layer is provided with a thickness to prevent generation of a void in the buried insulation layer of the trench, and wherein the second buffer layer functions as a seed layer for the buried insulation layer.

9. The method of claim 8, wherein the forming of the first buffer layer, the forming of the second buffer layer, and the depositing of the buried insulation layer are performed using an HDP process.

10. The method of claim 8, wherein each of the first and second buffer layers has a thickness of about 250 Å to 5 about 350 Å.

11. The method of claim 8, wherein the etching of the first and second buffer layers is performed using a fluorine (F) based etch gas.

12. The method of claim 8, wherein the etching of the first and second buffer layers is performed such that the liner nitride layer remains on the exposed surface of the trench.

13. The method of claim 8, wherein the etching of the buffer layer is targeted to etch away a thickness of about 85 Å to about 95 Å of the second buffer layer when each of the first and second buffer layers has a thickness of about 250 Å to about 350 Å.

14. The method of claim 8, further comprising performing a thermal oxidation process on the semiconductor substrate to form a sidewall oxide layer in the trench prior to the act of forming a liner nitride layer.

* * * * *